United States Patent [19]

Ando

[11] Patent Number: 4,611,134
[45] Date of Patent: Sep. 9, 1986

[54] BOOTSTRAP DRIVING CIRCUIT

[75] Inventor: Manabu Ando, Tokyo, Japan

[73] Assignee: NEC Corporation, Tokyo, Japan

[21] Appl. No.: 518,259

[22] Filed: Jul. 28, 1983

[30] Foreign Application Priority Data

Jul. 28, 1982 [JP] Japan .................. 57-131489

[51] Int. Cl.[4] .................. H03K 3/353; H03K 19/094
[52] U.S. Cl. .................. 307/482; 307/270; 307/445
[58] Field of Search .............. 307/482, 270, 445, 605

[56] References Cited

U.S. PATENT DOCUMENTS

| 4,090,096 | 5/1978 | Nagami | 307/482 |
| 4,382,194 | 5/1983 | Nakano et al. | 307/482 |
| 4,484,092 | 11/1984 | Campbell, Jr. | 307/482 |

Primary Examiner—Stanley D. Miller
Assistant Examiner—B. P. Davis
Attorney, Agent, or Firm—Sughrue, Mion, Zinn, Macpeak & Seas

[57] ABSTRACT

A driving circuit which can operates stably without being affected by noise or the like is disclosed.

The driving circuit comprises first and second field effect transistors connected in series at a first terminal, a capacitor coupled between the gate of the first transistor and the first terminal, a first control circuit responsive to one of binary levels of an input signal for applying electric charges from a potential source capable of conducting the first transistor to the gate of the first transistor, a second control circuit for applying electric charges from the potential source to the gate of the second transistor, and a third control circuit having a first input terminal receiving the input signal and a second terminal coupled to the gate of the first transistor, the third control circuit discharging the charge at the gate of the second transistor when the potential at the gate of the first transistor is such a value that it makes the first transistor conducting and the input signal is at the mentioned one of the binary levels.

12 Claims, 6 Drawing Figures

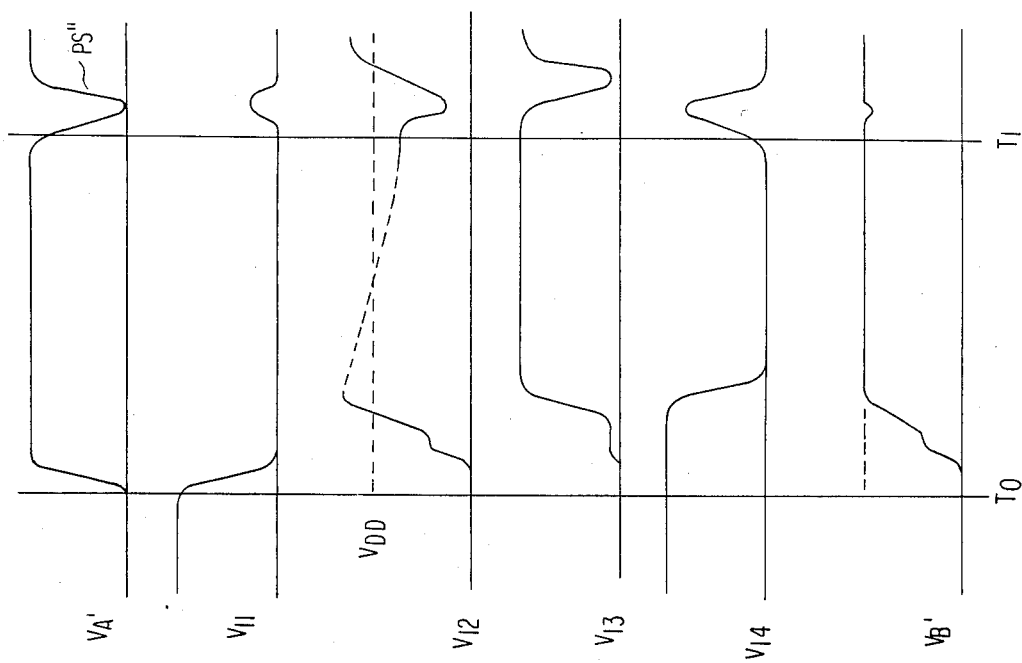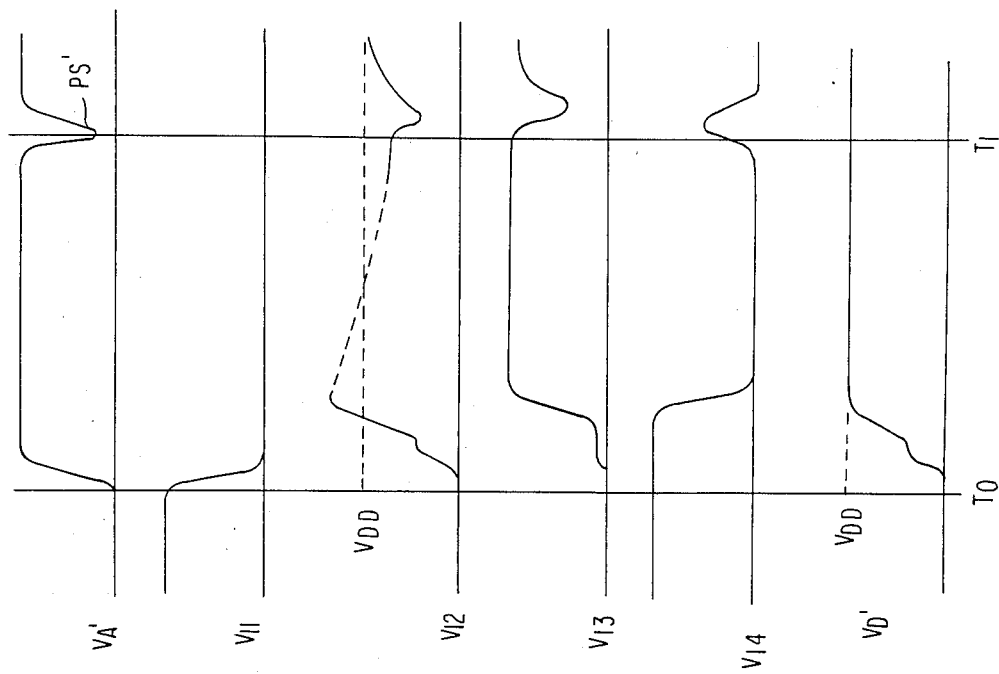

BOOTSTRAP DRIVING CIRCUIT

BACKGROUND OF THE INVENTION

This invention relates to a driving circuit employing insulated-gate field-effect transistors and more particularly, to a driving circuit of a boot-strap type which produces an output signal having a value of a power source voltage level by utilizing a boot strap effect.

A boot-strap circuit utilizing a boot-strap effect has gained a wide application as a driving circuit which can produce at an output terminal an output signal of a level equal to the power source voltage level as one of the two logic levels and has a large load driving capacity. For the boot-strap effect, a capacitor is connected between the output terminal and a gate of a first field effect transistor, which is in turn coupled between a power source terminal and the output terminal.

A second field effect transistor is coupled between the output terminal and a ground terminal and an input signal is applied to the gates of the first and the second transistors in the opposite phase and in the same phase, respectively. A delayed input signal is applied, in phase, to a gate of a third transistor which is coupled between the output terminal and the ground terminal. When the input signal changes from a high level to a low level, the second transistor turns to the non-conducting state, but the output terminal is clamped at a ground potential by the third transistor whose gate is still high level. Therefore, the boot-strap capacitor is changed by the high level applied to the gate of the first transistor. After a delay time is elapsed, the third transistor turns to the non-conducting state and a potential at the output terminal starts to rise toward the power source voltage which is applied to the output terminal through the conducting first transistor.

The rise of the potential at the output terminal is superposed on the gate potential of the first driving transistor through the charged capacitor. Accordingly, the gate potential of the first transistor rises above the power source level and therefore, this first transistor or a driving field effect transistor connected to the gate of the first transistor is driven in a non-saturation region to output the power source voltage without level reduction.

A typical example of the boot-strap circuit of the kind described above is disclosed in U.S. Pat. No. 3,898,479. However, the conventional boot-strap circuit of the prior art involves some drawbacks. After the boot-strap capacitor is changed and the third transistor is turned to the non-conducting state in response to the low level of the input signal, if a high level noise signal is added to the input signal, the second transistor becomes conducting to discharge the boot-strap capacitor, and the boot-strap effect is no longer exhibited even if the input signal returns thereafter to the low level. As a result, the potential at the output terminal cannot be raised higher than a value which is lower than the power source level by the threshold voltage of the field effect transistor. If the input signal takes the high level for a shorter period of time than the delay time for the gate signal of the third transistor, the output terminal is not clamped at the ground potential for the following low level input signal and the boot-strap capacitor is not charged to lose the boot-strap function.

SUMMARY OF THE INVENTION

It is therefore an object of the present invention to provide a driving circuit which can always raise the output potential to a power source level without being affected by noise or the like.

It is another object of the present invention to provide a boot-strap type driving circuit which operates stably.

The driving circuit according to the present invention comprises a first field effect transistor interposed between a first potential terminal and a first terminal; a second field effect transistor interposed between the first terminal and a second potential terminal; a capacitor interposed between the gate of the first field effect transistor and the first terminal; a first means for receiving an input signal having first and second logic levels; a second means coupled to the first means for making a potential at the gate of the first field effect transistor near a potential at the first potential terminal when the input signal is at the first level; and a third means coupled to the gate of the first field effect transistor, the first means and a gate of the second transistor for controlling the second transistor, the third means making the second transistor conducting only when the potential at the gate of the first transistor is near the potential value of the first potential terminal and the input signal takes the first level. In the present invention, charging of the capacitor is started when the input signal becomes at the first level by the second means. Under this state, as soon as the gate of the first field effect transistor is charged, such charged state of the first transistor is detected by the third means and the second transistor is turned off on the basis of the detection by the third means, so that the potential at the first terminal is changed from a potential at the second potential terminal towards the potential at the first potential terminal and the potential rise at the first terminal is applied to the gate of the first transistor via the capacitor.

Accordingly, the second transistor is turned off directly after the capacitor is fully charged and hence, the boot-strap effect can be obtained reliably. In the present invention, it is not necessary to use a charge control circuit for a capacitor having a fixed delay time in order to charge the capacitor. Hence, the driving circuit having a simplified construction and capable of operating at a high speed can be obtained.

In the present invention, the third means described above can be constituted by a NAND circuit whose input is connected to the gate of the first transistor and whose other input receives the input signal or a signal having the same phase as that of the input signal.

In the present invention, the second means can be constituted by a NOR circuit having one of its inputs connected to the input terminal and the other connected to the first terminal and an inverter circuit having its input connected to the output of the NOR circuit and its output connected to the gate of the first transistor.

In accordance with the above-mentioned feature of the present invention employing the circuit construction described above, the signal of the first terminal is applied to the other input of the NOR circuit which receives the input signal, so that even if the input signal changes temporarily to the second level due to noise or the like during the signal of the first terminal is to be at the power source level, this change does not appear in the output of the NOR circuit. For this reason, there is obtained a driving circuit which is highly resistant to noise and has stable operation.

According to the present invention, there is obtained a driving circuit comprising a data input terminal, a first field effect transistor having one of a drain and a source connected to an output terminal and the other of the drain and source connected to a source of a first potential; a second field effect transistor having one of a drain and a source connected to a source of a second potential and the other of the drain and the source connected to the output terminal, a boot capacitor having one end coupled to the gate of the second transistor; a logical sum circuit (NOR circuit) coupled to the gate of the second transistor and the data input terminal at their input terminals, whose output terminal is connected to the gate of the first transistor; a first inverter circuit coupled to the output terminal of the logical sum circuit at its input terminal and having its output connected to the gate of the first transistor; a logical product circuit (NAND circuit) receiving signals from the output terminal of the first inverter circuit and the data input terminal; and a second inverter circuit receiving a signal from the output terminal of the logical product circuit at its input terminal and having its output terminal connected to the other end of the boot capacitor.

BRIEF DESCRIPTION OF THE DRAWINGS

FIGS. 4 through 6 are operation waveform diagrams at each potential point of the circuit of FIG. 3.

DESCRIPTION OF THE PREFERRED EMBODIMENTS

In the description which follows, N-channel MOS-FETs are used as the field effect transistors, and $V_{DD}$ of a positive value is used as a power source and positive logic system in which a potential of the power source $V_{DD}$ corresponds to a logic "1" while a ground level corresponds to a logic "0".

First, the conventional driving circuit will be explained with reference to FIGS. 1 and 2.

Figure 1:
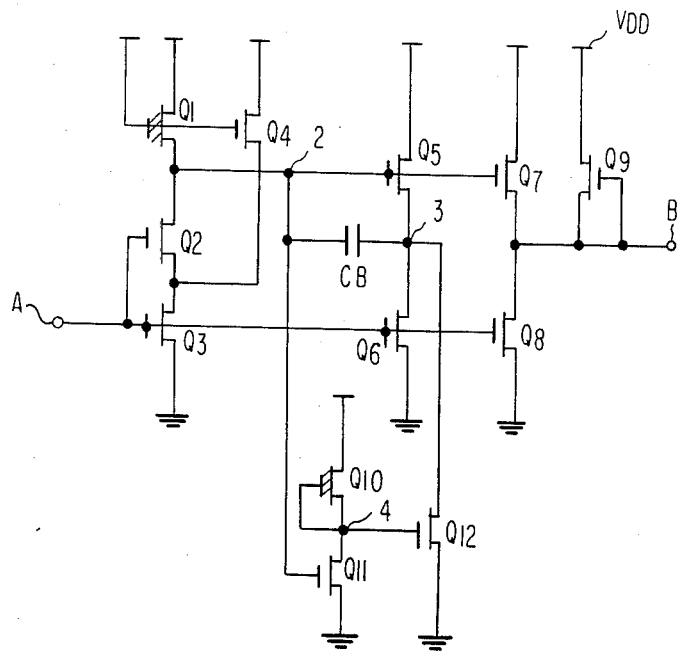
FIG. 1 is a circuit diagram of the prior art circuit.

In FIG. 1, FETs $Q_1$, $Q_9$ and $Q_{10}$ are of depletion type MOSFETs with the rest being of enhancement type MOSFETs.

Figure 2:
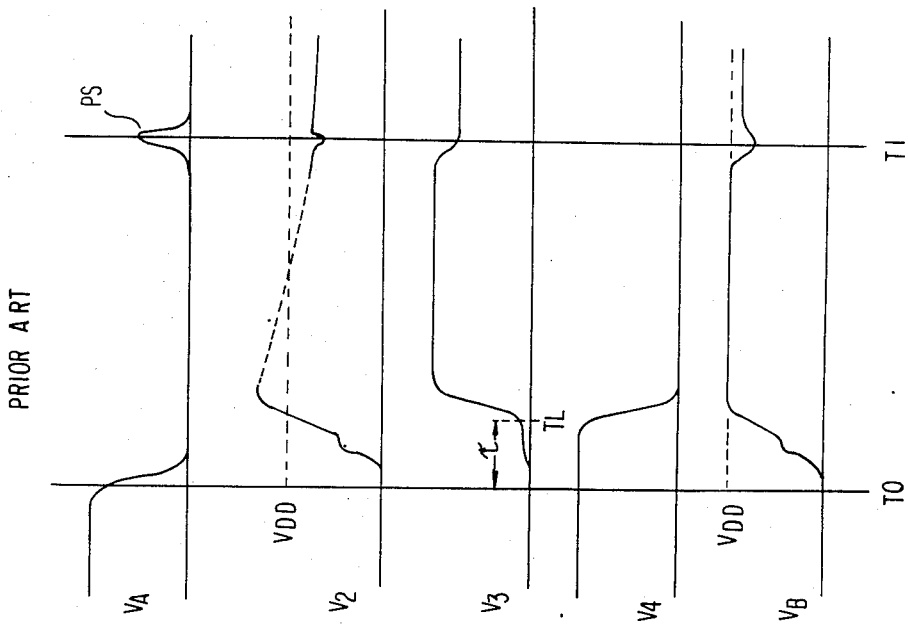
FIG. 2 is an operation waveform diagram at each potential point of the circuit of FIG. 1.

The operation of this circuit will be described with reference to FIG. 2 showing the operation waveform at each potential point. It will be first assumed that an input signal $V_A$ applied to an input terminal A at a time point $T_o$ changes from a high level to low level and is held for a certain long period of time longer than the time required for charging a boot capacitor $C_B$. In this case, a potential $V_2$ at a node 2 as one end of the boot capacitor $C_B$ rises to the high level when the input signal VA drops to the low level. While a transistor $Q_{12}$ is still kept in conducting state during a period $\tau$ determined by a delay characteristic of a delay circuit composed of FETs $Q_{10}$ and $Q_{11}$ to charge the capacitor $C_B$. After the period $\tau$ has elapsed, a potential $V_3$ at a node 3 as the other end of the capacitor $C_B$ starts to change towards the potential $V_{DD}$ at a time point $T_L$.

This rise in potential at the node 3 is fed back to the node 2 through the charged boot capacitor $C_B$ and rises the level $V_2$ of the node 2 to a level higher than the power source level $V_{DD}$. As a result, the gate potential ($V_2$) of the second FET $Q_7$ becomes higher than the $V_{DD}$ level and the output signal $V_B$ at the terminal B of the first FET $Q_8$ as the output FET rises to the $V_{DD}$ level. The potential $V_2$ at the node 2 once rises above the $V_{DD}$ level as shown in FIG. 2 but since the charge is not thereafter supplied, it drops to a level that is determined by $V_{DD}-V_{TQ1}$ (threshold voltage of FET $Q_1$). Nonetheless, the level $V_B$ of the output terminal B is kept at the $V_{DD}$ level by the level compensating FET $Q_9$.

However, when a short pulse-like signal PS such as a noise signal is applied to the input terminal at a time point $T_1$ in FIG. 2, for example, a FET $Q_6$ becomes conducting to discharge the charge of the capacitor $C_B$ to the ground and hence the boot-strap circuit does not operate and the level at the output signal $V_B$ at the terminal B drops below the $V_{DD}$ level, whereby the stable operation of the driving circuit is impeded.

Moreover, when the period in which the input terminal A is at the high level is short, the boot-strap effect is not attained. When the potential at the input terminal A rises to the high level and shortly drops to the low level, the level at the node 2 starts rising before the delay circuit for the boot capacitor (FETs $Q_{10}$ and $Q_{11}$) and the FET $Q_{12}$ is completely reset (that is, the level of the node 4 rises to the sufficiently high level) and the level at the node 3 does not yet drop sufficiently to the low level. As a result, the charging time becomes insufficient and the boot-strap effect can not be obtained, so that the output level does not rapidly rise to the $V_{DD}$ level. This means that in accordance with the prior art circuit, since the reset of the delay circuit for the boot capacitor is effected more belatedly than the reset of the output terminal B and the nodes 2 and 3, the boot-strap effect will be lost if the input changes at the terminal A within a short period of time from the start of fall of the output till the reset of the delay circuit.

Moreover, since the gate signal (VA) is common for FETs $Q_2$, $Q_3$, $Q_6$, and $Q_8$ which reset the other end (node 3) of the boot-strap capacitor $C_B$, one end of the boot capacitor (node 2) and the output B, the level at the output terminal B may drop even in the circuit state where the boot-strap circuit does not operate. Especially when the potential at the node 3 settles at the $(V_{DD}-V_{TQ1}-V_{TQ5})$ level, the boot capacitor $C_B$ is hardly charged. If a short pulse is applied to the input under this state, the nodes 2 and 3 and the output terminal B remain at somewhat reduced levels and it takes some time before they return to the $V_{DD}$ level.

As described above, the prior art circuit involves the problem of the unstable operation that when a short pulse-like signal having a time width shorter than the charging time of the boot capacitor $C_B$ is applied, for example, the boot-strap circuit does not operate sufficiently, and the output level drops below the $V_{DD}$ level and the restoration of the state is time consuming.

Hereinafter, the present invention will be described in detail with reference to the drawings.

Figure 3:
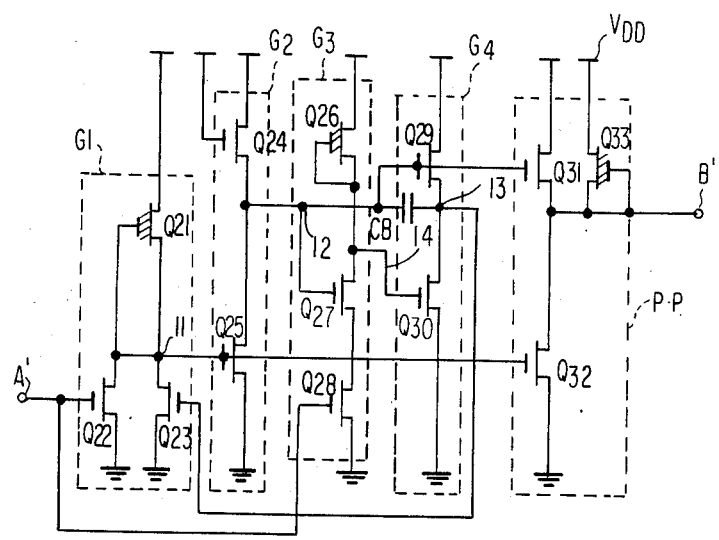
FIG. 3 is a circuit diagram of a driving circuit according to one embodiment of the present invention.

FIG. 3 is a circuit diagram of a driving circuit in accordance with one embodiment of the present invention. In the drawing, FETs $Q_{21}$, $Q_{26}$, $Q_{33}$ are depletion type FETs and FETs $Q_{22}$ to $Q_{25}$ and $Q_{27}$ to $Q_{32}$ are enhancement type FETs. In this embodiment, FETs $Q_{21}$ and $Q_{22}$ form a two-input NOR circuit $G_1$ receiving signals from the node 13 and the data input terminal A'. A first inverter circuit $G_2$ consisting of FETs $Q_{24}$ and $Q_{25}$ receives a signal from the output of the NOR circuit $G_1$ and its output (at a node 12) is connected to one end (node 12) of a boot capacitor $C'_B$. FETs $Q_{26}$, $Q_{27}$ and $Q_{28}$ form a two-input NAND circuit $G_3$ receives signal from the output (node 12) of the first inverter circuit $G_2$ and from the input terminal A' at their input terminals. FETs $Q_{29}$ and $Q_{30}$ form a second inverter circuit $G_4$ receives a signal from the output (node 14) of the NAND circuit $G_3$ at its input terminal and its output is coupled to the other end (node 13) of the boot capacitor $C'_B$. An output stage push-pull circuit p.p is composed of a first output FET $Q_{32}$ having the gate thereof connected to the output of the NOR circuit $G_1$, the source thereof grounded and the drain thereof connected to the output terminal B', a second FET $Q_{31}$ having the gate thereof connected to one end (node 12) of the boot capacitor $C'_B$, the drain thereof connected to the power source voltage $V_{DD}$. and the source thereof connected to the output terminal B', and a level conpensating FET $Q_{33}$ having the gate and source thereof connected to the output terminal B' and the drain thereof connected to the power source voltage $V_{DD}$.

The fundamental difference of the circuit of this embodiment from the circuit of the prior art shown in FIG. 1 is that the two-input NAND circuit $G_3$ is disposed in place of the delay circuit for controlling the charge of the boot capacitor, consisting of FETs $Q_{10}$, $Q_{11}$ and $Q_{12}$, that is shown in FIG. 1.

This NAND circuit $G_3$ turns off FET $Q_{30}$ and raises the potential at one end of the boot capacitor $C'_B$ above the power source level $V_{DD}$ due to the boot-strap effect only when the input signal to the terminal A' is at such a level that makes the level of the output terminal B' high, that is, at the high level and moreover, when the potential at one end (12) of the boot capacitor $C'_B$ becomes high as the capacitor is charged.

The two-input NOR circuit $G_1$ has the function of keeping the level of the node 11 at a low level and eliminating the influence of noise when a low level signal such as the noise is applied to the input terminal A' while the potential at the node 13 is at the high level.

Figure 4:
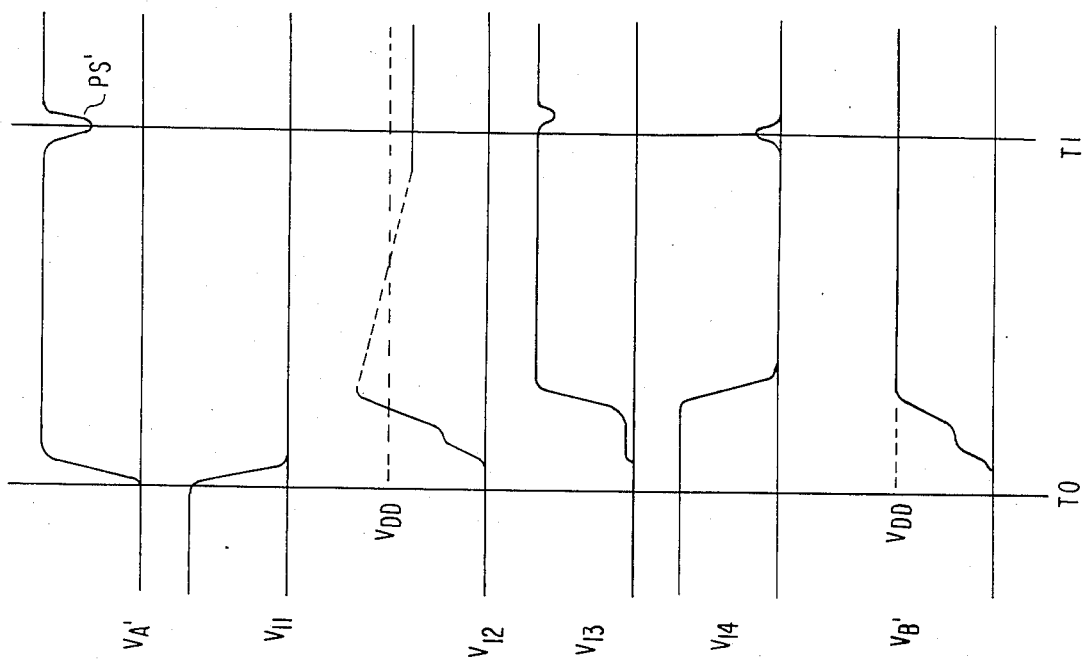

Hereinafter, the operations of the circuit of this embodiment will be described with reference to FIGS. 4 through 6 illustrating the operating waveform at each potential point.

Referring initially to FIG. 4, the explanation will be made on the cases where the input signal at the input terminal A' changes in the ordinary manner and where it is a pulse-like signal having a short period, respectively. First, the normal operation will be described in which the input signal $V_{A'}$ applied to the input terminal A' at a time point $T_o$ changes from the low level to high and is kept at that level for a certain long period of time (longer than the time necessary for charging the boot capacitor). When the input signal $V_{A'}$ at the input terminal A' changes from the low level to high, the level $V_{11}$ at the node 11 as the output of the NOR circuit $G_1$ drops from the high level to low in response to the former, whereupon FETs $Q_{25}$ and $Q_{32}$ are turned off and the level $V_{12}$ at the node 12 and output signal $V_{B'}$ at the output terminal B' starts rising from the low level to the high level ($V_{DD}$ level). When the potential $V_{12}$ at the node 12 attains the high level, the level $V_{14}$ at the output node 14 of the NAND circuit $G_3$ drops to the low level because their both inputs (the signals $V_{12}$ and VA) are at the high level. As a result, FET $Q_{30}$ is turned off and the level $V_{13}$ of the node 13 rises from the low level to the high level. Thus, the level $V_{12}$ at the node 12 is boosted above the $V_{DD}$ level and the level $V_{B'}$ at the output terminal B' rises up to the $V_{DD}$ level, thereby providing the output of the $V_{DD}$ level.

Next, the explanation will be made on the case where a pulse-like signal PS' having a short period is applied to the input terminal A' as represented by the point of time $T_1$ in FIG. 4. Since the gate of FET $Q_{23}$ is kept at the high level of the node 13 irrespectively of this small pulse-like signal PS' applied to the gate of FET $Q_{22}$, the level $V_{11}$ of the node 11 is kept at the low level and hence, both FETs $Q_{25}$ and $Q_{32}$ keep the off state, so that the level $V_{12}$ at the node 12 and the output signal $V_{B'}$ at the output terminal B' remain unchanged, holding the output at the $V_{DD}$ level.

Even when the magnitude of this pulse-like signal PS' having a short period, which is applied at the point of time $T_1$, is greater than that shown in FIG. 4 as shown in FIG. 5, the level $V_{11}$ at the node 11 is held at the low level so that the output signal $V_{B'}$ is kept at the $V_{DD}$ level. On the other hand, the level rise in the signal $V_{14}$ at the node 14 becomes relatively great and the drop of the level $V_{13}$ at the nodes 13 and the level $V_{12}$ at the node 12 becomes great in response to the former, but this does not affect the output level $V_{B'}$.

Furthermore, when the magnitude of the pulse-like signal PS" of the short period applied at the point of time $T_1$ is much more greater than that of the case shown in FIG. 5, as illustrated in FIG. 6, an extremely slight drop can be observed in the level of the output signal $V_{B'}$ but it immediately returns to the $V_{DD}$ and hence, does not substantially deteriorate the characteristics. In other words, as the level $V_{14}$ rise of the node 14 becomes great and along therewith, the boot-strap circuit is reset because the level $V_{13}$ of the node 13 drops near the low level. Accordingly, as the pulse input PS" changes from the low level to the high level, the level $V_{12}$ of the node 12 rises and after the boot capacitor $C'_B$ is charged, the level $V_{14}$ of the node 14 drops to the low level while the level $V_{13}$ of the node 13 rises. Accordingly, the boot-strap circuit operates reliably, the level $V_{12}$ of the node 12 rapidly exceeds the $V_{DD}$ level and the output terminal B' rapidly returns to the $V_{DD}$ level.

As has been described in detail with reference to one embodiment, the circuit of the present invention sets the resetting sequence as follows:
(1) charge control circuit (NAND circuit $G_3$)
(2) the other end (node 13) of boot capacitor
(3) one end (node 12) of boot capacitor
(4) output terminal B'.

The circuit of the invention makes use of the NAND logic between the node 12 and the input terminal signals as the input signal for the charge control circuit and the NOR logic between the node 13 and the input terminal signal as the resetting signal for the node 12 and the output terminal B'. At the time of reset, therefore, the node 14 first rises and then reduces the level of the nose 13. At this time, the level of the node 12 starts once dropping due to coupling of the boot capacitor $C'_B$ but the capacitor is again charged by FET $Q_{24}$. The node 11 remains at the low level until the node 13 falls, so that the level of the node 12 and the output level do not fall. Under this state, the node 11 remains at the low level even when the input signal rises to the high level and hence, the output keeps the $V_{DD}$ level.

When the level of the node 13 drops and the level of the node 11 rises, the level of the node 12 is reduced by FET $Q_{25}$ and the level of the output terminal B', by FET $Q_{32}$. However, since the boot capacitor charge control circuit has already been fully reset by this time, the boot-strap circuit operates completely and the output rapidly reaches the $V_{DD}$ level whenever the input terminal rises to the high level.

Incidentally, the NOR and NAND circuits used in the embodiment described above may be naturally replaced by logic circuits equivalent to them. Though the N-channel type MOS transistors are used as the field effect transistors in the embodiment, the principle of the invention can be naturally applied to all the insulated gate field effect transistors.

As described in detail above, the present invention provides a driving circuit which always raises the output to the power source voltage level under all the input conditions and operates stably. Hence, the effect of the invention is great and remarkable.

I claim:

1. A driving circuit comprising a first field effect transistor coupled between a first terminal and a first potential terminal, a second field effect transistor coupled between said first terminal and a second potential terminal, a capacitor coupled between a gate of said first transistor and said first terminal, a first means for receiving an input signal having first and second logic levels, a second means coupled to both of said first means and said first terminal for rendering said first field effect transistor conductive when said input signal is at said first logic level and/or the signal at said first terminal is near said first potential, and a third means coupled to the gate of said first field effect transistor, said first means and a gate of said second field effect transistor for controlling said second transistor, said third means making said second transistor non-conducting only when the potential at the gate of said first transistor is near said first potential and said input signal takes said first logic level.

2. The circuit according to claim 1, in which said third means includes a series of third and fourth field effect transistors coupled between said first and second potential terminals, a gate of said third transistor being coupled to the gate of said first transistor and a gate of said fourth transistor being coupled to said first means, means for connecting one end of said series circuit of said third and fourth transistors to the gate of said second transistor, and control means responsive to said input signal for supplying said gate of said first transistor with a signal having the same phase as said input signal.

3. The circuit according to claim 2, in which said control means including a NOR circuit receiving said input signal and a signal from said second terminal as its logic inputs, and an inverter receiving an output signal of said NOR circuit and means for applying an output signal of said inverter circuit to said gate of said first transistor.

4. The circuit according to claim 2, in which said third transistor is a depletion type.

5. A driving circuit comprising a first field effect transistor coupled between a first terminal and a second terminal, a second field effect transistor coupled between said second terminal and a third terminal, means for applying a first potential to said first terminal, means for applying a second potential to said third terminal, a capacitance coupled between a gate of said first transistor and said second terminal, a third field effect transistor coupled between said first terminal and a fourth terminal, a first series circuit of fourth and fifth field effect transistors coupled between said fourth terminal and said third terminal, means for connecting a gate of said fourth transistor to the gate of said first transistor, means for connecting said fourth terminal to a gate of said second transistor, means for receiving an input signal, means supplying a gate of said fifth transistor with a signal of the same phase as said input signal, and control means adapted to receive both of said input signal and a signal at said second terminal, said control means operatively rendering said first field effect transistor conductive when either said input signal or the signal at said second terminal is near said first potential.

6. The circuit according to claim 5, in which said control means including a NOR circuit receiving said input signal and a signal from said second terminal as its logic inputs, and an inverter receiving an output signal of said NOR circuit and means for applying an output signal of said inverter circuit to said gate of said first transistor.

7. The circuit according to claim 6, in which said third transistor is a depletion type.

8. A driving circuit comprising a series circuit of first and second field transistors connected at a first terminal in series, means for receiving an input signal, a capacitor coupled between a gate of the first transistor and said first terminal, a NAND circuit receiving a signal from the gate of said first transistor and a signal for the same phase as said input signal as its logic input signals, means for applying an output signal of said NAND circuit to a gate of said second transistor, and control means for receiving both of said input signal and a signal at said first terminal and operatively rendering said first transistor conductive when either said input signal or the signal at said first terminal is at an active level which itself makes said first transistor conductive.

9. A driving circuit comprising a series circuit of first and second field effect transistors connected in series at a first terminal, an input terminal receiving an input signal, a capacitor coupled between the gate of said first transistor and said first terminal, a NOR circuit having a first input end coupled to said input terminal and a second input terminal coupled to said first terminal, an inverter circuit having an input terminal coupled to an output terminal of said NOR circuit, means for connecting the output of said inverter circuit to the gate of said first transistor, a NAND circuit having a first input end coupled to the said input terminal and a second input end coupled to the output of said inverter circuit, and means for connecting an output of said NAND circuit.

10. The circuit according to claim 9, further comprising third and fourth field effect transistors connected in series at a second terminal, means for connecting a gate of said third transistor to the gate of said first transistor and means for connecting a gate of said fourth transistor to the output of said NOR circuit.

11. A driving circuit comprising a first field effect transistor coupled between a first terminal and a first potential terminal, a second field effect transistor coupled between said first terminal and a second potential terminal, a capacitor coupled between a gate of said first transistor and said first terminal, a first means for receiving an input signal having first and second logic levels, a second means coupled to said first means for making a potential at the gate of said first field effect transistor near a first potential at said first potential terminal in response to said first logic level of said input signal, and a third means coupled to the gate of said first field effect transistor, said first means and a gate of said second field effect transistor for controlling said second transistor, said third means making said second transistor non-conducting only when the potential at the gate of said first transistor is near said first potential and said input signal takes said first logic level, said third means includes a series circuit of third and fourth field effect transistors coupled between said first and second potential terminals, a gate of said third transistor being coupled to the gate of said first transistor and a gate of said fourth transistor being coupled to said first means, and means for connecting one end of said series circuit of said third and fourth transistors to the gate of said second transistor.

12. A driving circuit comprising a first field effect transistor coupled between a first terminal and a first potential terminal, a second field effect transistor coupled between said first terminal and a second potential terminal, a capacitor coupled between a gate of said first transistor and said first terminal, a first means for receiving an input signal having first and second logic levels, a second means coupled to said first means for making a potential at the gate of said first field effect transistor near a first potential at said first potential terminal in response to said first logic level of said input signal, and a third means coupled to the gate of said first field effect transistor, said first means and a gate of said second field effect transistor for controlling said second transistor, said third means making said second transistor non-conducting only when the potential at the gate of said first transistor is near said first potential and said input signal takes said first logic level, said second means including a NOR gate having a first input end coupled to said first means and a second input end coupled to said first terminal.

* * * * *